(12) United States Patent
Takeshita et al.

(10) Patent No.: US 11,315,844 B2
(45) Date of Patent: Apr. 26, 2022

(54) ELECTRONIC DEVICE MOUNTING BOARD, ELECTRONIC PACKAGE, AND ELECTRONIC MODULE

(71) Applicant: KYOCERA Corporation, Kyoto (JP)

(72) Inventors: Fumiaki Takeshita, Esslingen (DE); Teruaki Nonoyama, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 17/050,672

(22) PCT Filed: Jan. 31, 2019

(86) PCT No.: PCT/JP2019/003377
§ 371 (c)(1),
(2) Date: Oct. 26, 2020

(87) PCT Pub. No.: WO2019/207884
PCT Pub. Date: Oct. 31, 2019

(65) Prior Publication Data
US 2021/0242099 A1 Aug. 5, 2021

(30) Foreign Application Priority Data
Apr. 26, 2018 (JP) .............................. JP2018-085339

(51) Int. Cl.
*H05K 1/18* (2006.01)
*H01L 23/15* (2006.01)
*H05K 1/11* (2006.01)

(52) U.S. Cl.
CPC .............. *H01L 23/15* (2013.01); *H05K 1/111* (2013.01); *H05K 1/183* (2013.01); *H05K 2201/09036* (2013.01)

(58) Field of Classification Search
CPC .. H05K 1/113; H05K 2201/092; H05K 1/111; H05K 2201/09036; H05K 1/182;
(Continued)

(56) References Cited

U.S. PATENT DOCUMENTS 4,320,438 A * 3/1982 Ibrahim ................ H01L 23/057
174/535
6,479,901 B1 * 11/2002 Yamada .............. H01L 23/3128
257/689
(Continued)

FOREIGN PATENT DOCUMENTS

| JP | 06-302709 A | 10/1994 |
| JP | 2000-188351 A | 7/2000 |

(Continued)

OTHER PUBLICATIONS

JP2006/261286 English Translation, Takuji Ikeda (Year: 2006).*

*Primary Examiner* — Steven T Sawyer
(74) *Attorney, Agent, or Firm* — Volpe Koenig

(57) ABSTRACT

A substrate has a first surface and a second surface opposite to the first surface. The substrate has at least one first recess on the first surface and a second recess on the second surface. The substrate includes electrode pads. The electrode pads are in the at least one first recess. The substrate has the at least one first recess located separate from the second recess in a plan view.

11 Claims, 14 Drawing Sheets

(58) Field of Classification Search
CPC ........ H05K 1/183; H05K 1/184; H05K 1/185;
H05K 2201/017; H05K 1/0306; H05K
2201/09845; H05K 1/0203; H05K
1/0207; H05K 2201/10106; H01L 23/15;
H01L 33/642; H01L 33/486; H01L
2224/48227; H01L 33/641; H01L
2224/48091; H01L 2224/48137; H01L
2924/10253; H01L 2924/181
See application file for complete search history.

(56) References Cited

U.S. PATENT DOCUMENTS

| | | |
|---|---|---|
| 6,818,978 B1 | 11/2004 | Fan |
| 2007/0252286 A1* | 11/2007 | Kunimoto ......... H01L 23/49816 |
| | | 257/778 |
| 2007/0289127 A1* | 12/2007 | Hurwitz ............... H05K 3/4697 |
| | | 29/827 |
| 2009/0032294 A1* | 2/2009 | Hsu ...................... H05K 3/3473 |
| | | 174/257 |
| 2009/0200650 A1 | 8/2009 | Tan |
| 2011/0233601 A1* | 9/2011 | Nakayama ............ H01L 33/642 |
| | | 257/99 |
| 2014/0138134 A1* | 5/2014 | Imafuji .................. H05K 1/111 |
| | | 174/257 |
| 2015/0382456 A1* | 12/2015 | Saidou ................ H05K 3/3452 |
| | | 361/760 |
| 2017/0040497 A1 | 2/2017 | Tagami et al. |
| 2019/0021167 A1* | 1/2019 | Yamamoto ............ H05K 1/119 |

FOREIGN PATENT DOCUMENTS

| | | |
|---|---|---|
| JP | 2006-253600 A | 9/2006 |
| JP | 2017-034138 A | 2/2017 |

\* cited by examiner

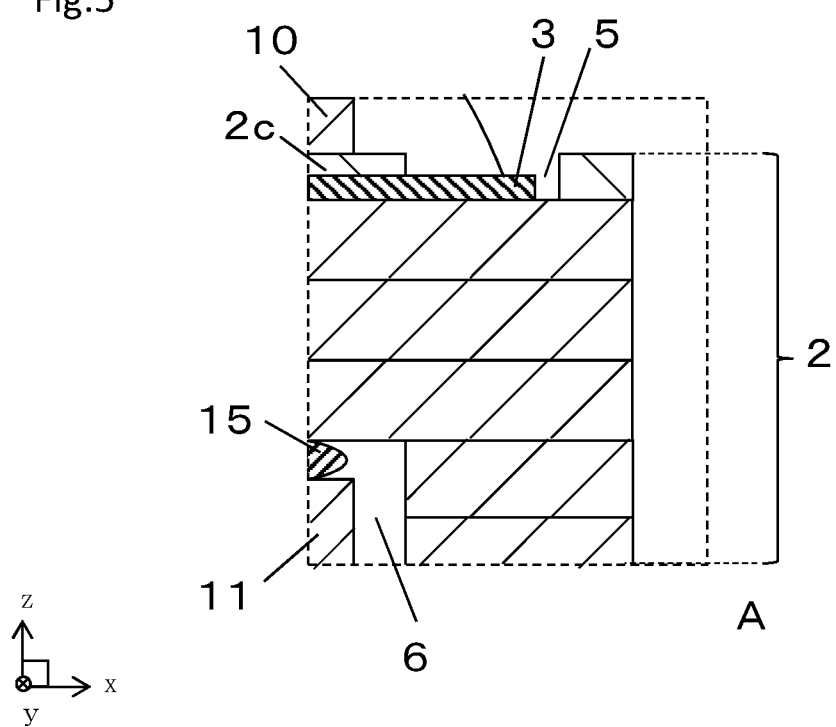

ELECTRONIC DEVICE MOUNTING BOARD, ELECTRONIC PACKAGE, AND ELECTRONIC MODULE

FIELD

The present invention relates to an electronic device mounting board on which an electronic device such as an imaging device including a charge-coupled device (CCD) or a complementary metal-oxide semiconductor (CMOS) device, a light-emitting device including a light-emitting diode (LED), a device for sensing pressure, air pressure, or acceleration, or a gyro sensor, or an integrated circuit is mountable, and to an electronic package and an electronic module.

BACKGROUND

A known electronic device mounting board includes a wiring board including insulating layers. This electronic device mounting board may have electrode pads on its front and back surfaces for mounting electronic devices or electronic components (refer to Japanese Unexamined Patent Application Publication No. 2000-188351).

Mounting the electronic components or the electronic devices typically involves placing either the electrode pads on the front surface or the electrode pads on the back surface onto a fixture or another tool. The electrode pads may be damaged and may cause defective mounting of the electronic components or the electronic devices.

BRIEF SUMMARY

An electronic device mounting board according to one aspect of the present invention includes a substrate having a first surface and a second surface opposite to the first surface, at least one first recess on the first surface, a second recess on the second surface, and electrode pads in the at least one first recess. The at least one first recess is located separate from the second recess in a plan view.

An electronic device mounting board according to another aspect of the present invention includes a substrate having a first surface and a second surface opposite to the first surface, at least one first recess on the first surface, a second recess on the second surface, and electrode pads in the at least one first recess. The electrode pads are located separate from the second recess in a plan view.

An electronic package according to still another aspect of the present invention includes an electronic device mounting board, and an electronic device mounted in a mount area.

An electronic module according to still another aspect of the present invention includes an electronic package, and a housing over the electronic package.

BRIEF DESCRIPTION OF DRAWINGS

FIG. 5 is an enlarged view of an electronic device mounting board and an electronic package according to a modification of the first embodiment of the present invention showing the main part A.

DETAILED DESCRIPTION

Structures of Electronic Device Mounting Board and Electronic Package

Embodiments of the present invention will now be described by way of example with reference to the drawings. In the embodiments described below, an electronic package includes an electronic device mounted on an electronic device mounting board. An electronic module includes a housing or a member located on the upper surface of the electronic device mounting board or covering the electronic device. Although the electronic device mounting board, the electronic package, and the electronic module may have any of their faces being upward or downward, they are herein defined using the orthogonal xyz coordinate system with the positive z-direction being upward for ease of explanation.

First Embodiment

Figure 1A:
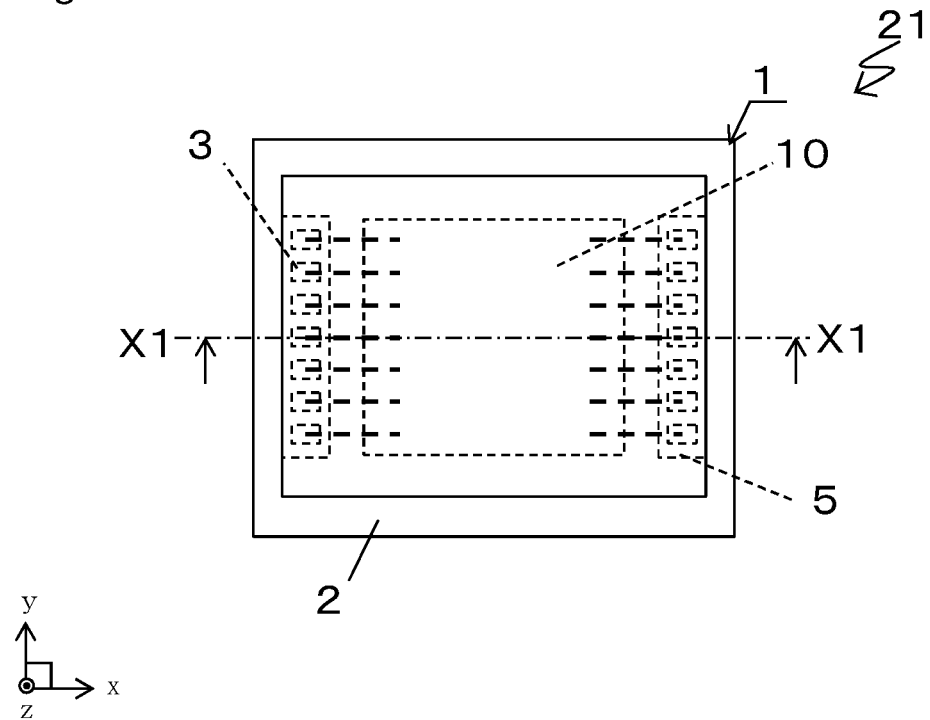
FIG. 1A is an external top view of an electronic device mounting board and an electronic package according to a first embodiment of the present invention.
Figure 1B:
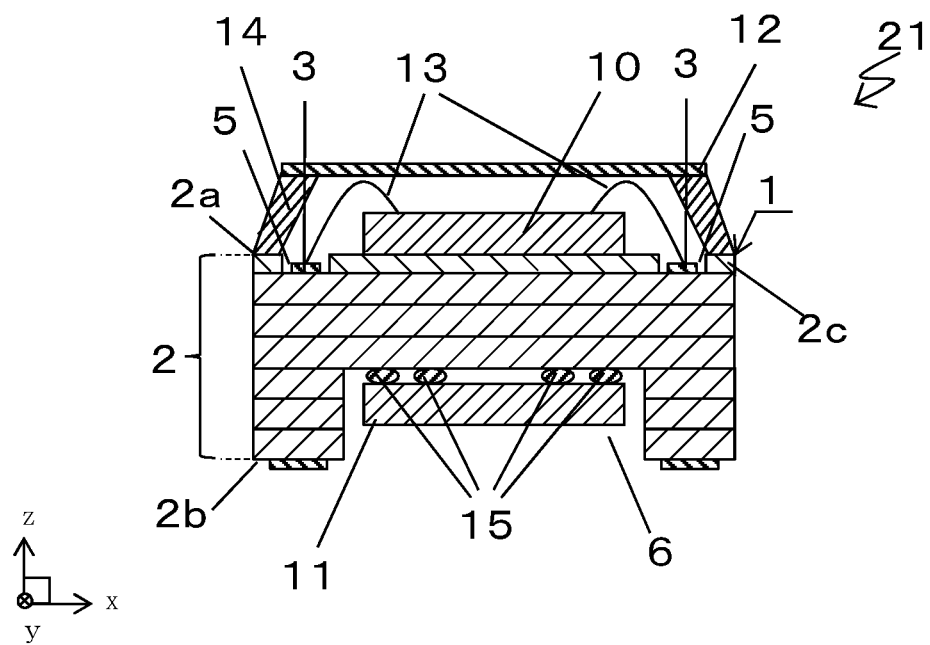
FIG. 1B is a cross-sectional view taken along line X1-X1 in FIG. 1A.
Figure 2A:
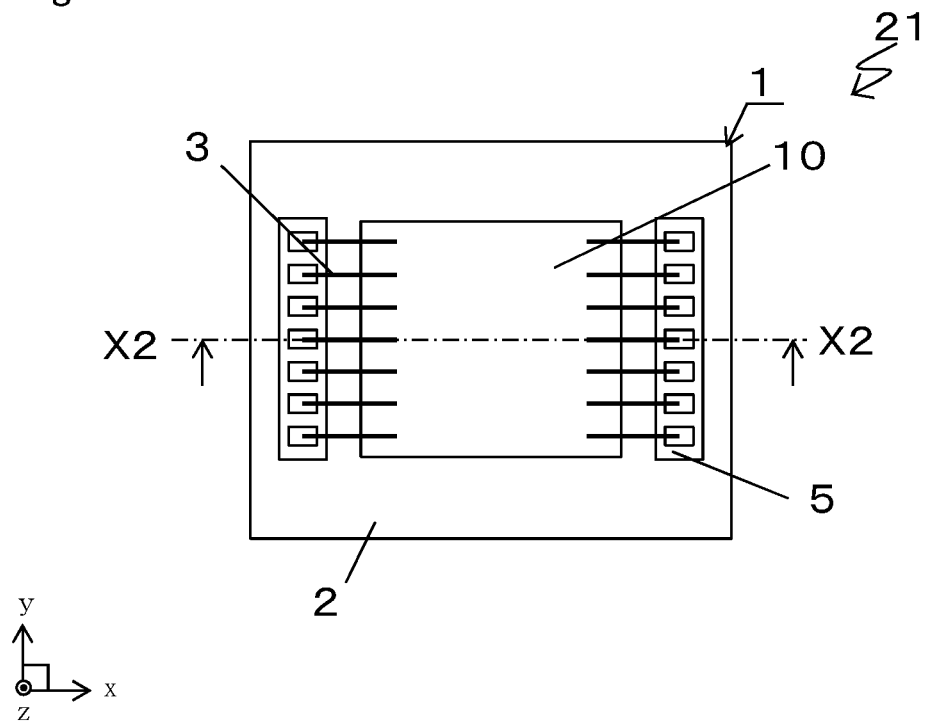
FIG. 2A is an external top view of an electronic device mounting board and an electronic package according to a modification of the first embodiment of the present invention without showing a lid.
Figure 2B:
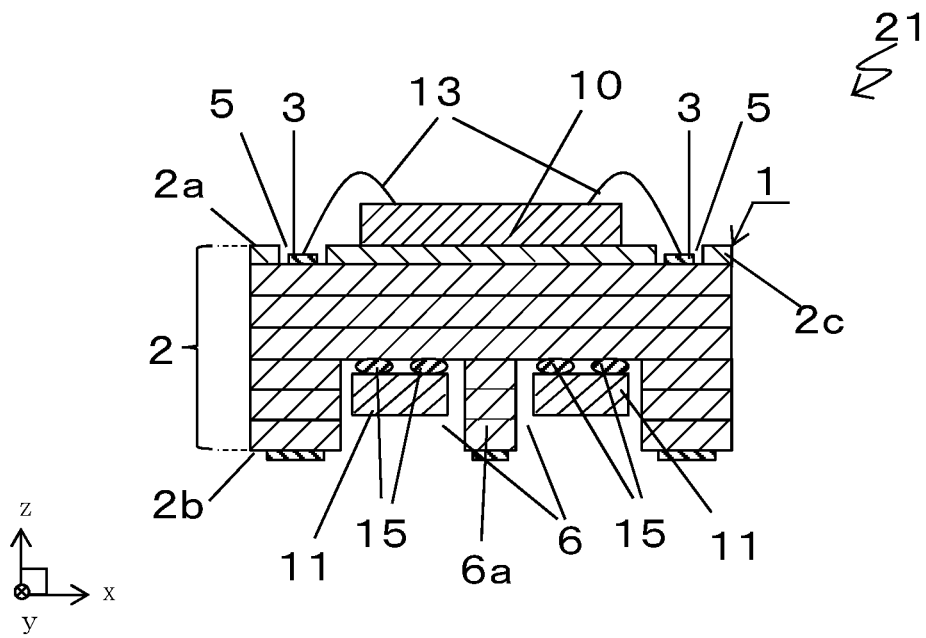
FIG. 2B is a cross-sectional view taken along line X2-X2 in FIG. 2A.
Figure 3A:
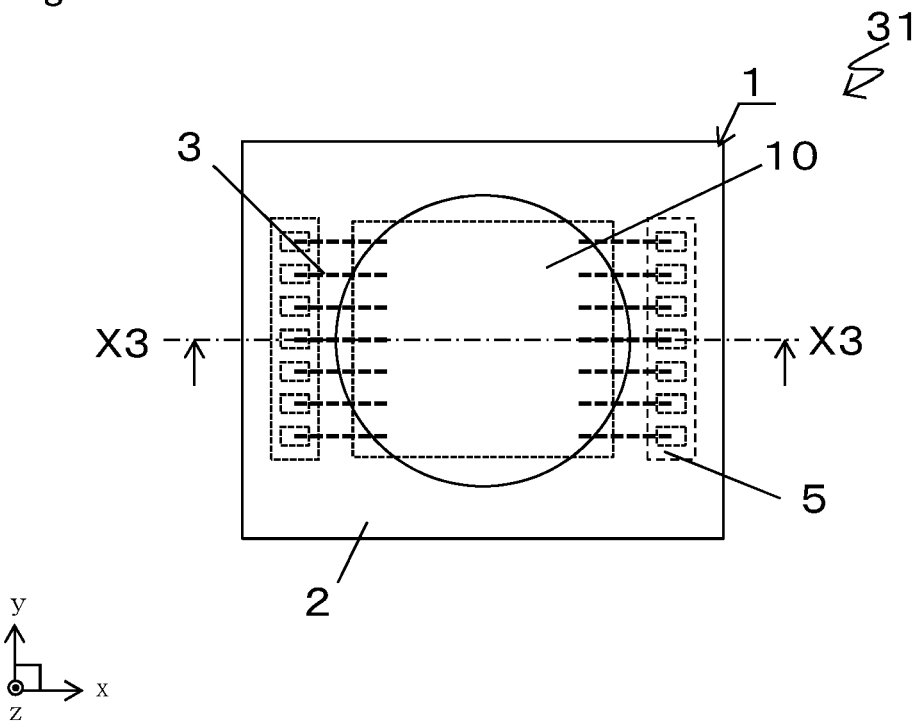
FIG. 3A is an external top view of an electronic module according to a modification of the first embodiment of the present invention.
Figure 3B:
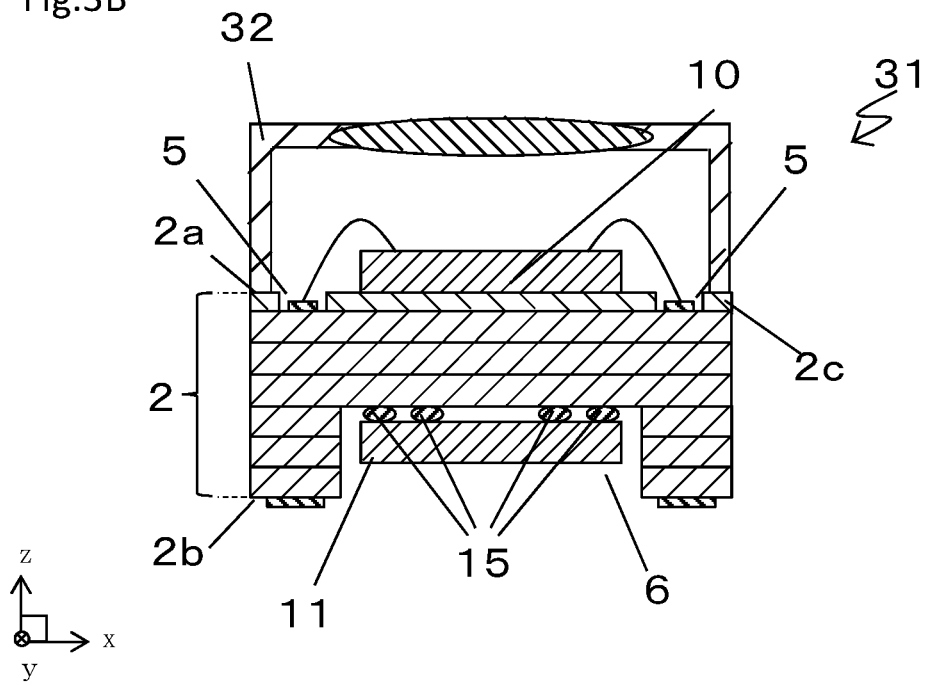
FIG. 3B is a cross-sectional view taken along line X3-X3 in FIG. 3A.

An electronic module 31, an electronic package 21, and an electronic device mounting board 1 according to a first embodiment of the present invention will now be described with reference to FIGS. 1A to 5. In the present embodiment, FIGS. 1A and 1B show the electronic package 21, and FIGS. 2A and 2B show the electronic package 21 without a lid 12. FIGS. 3A and 3B show the electronic module 31. FIGS. 4B and 5 are enlarged cross-sectional views of the electronic device mounting board 1 showing its main part A.

The electronic device mounting board 1 includes a substrate 2 having a first surface 2a and a second surface 2b opposite to the first surface 2a. The substrate 2 has a first recess 5 on the first surface 2a and a second recess 6 on the second surface 2b. The substrate 2 includes electrode pads 3. The electrode pads 3 are located in the first recess 5. The substrate 2 has the first recess 5 located separate from the second recess 6 in a plan view. More specifically, the first recess 5 avoids overlapping the second recess 6 in a plan view and in a cross-sectional view.

The electronic device mounting board 1 includes the substrate 2 having the first surface 2a and the second surface 2b opposite to the first surface 2a. In the example shown in FIGS. 1A and 1B, the first surface 2a is the uppermost surface of the substrate 2 and the second surface 2b is the lowermost surface of the substrate 2. In one example, another insulating layer in the shape of, for example, a frame may be located on the first surface 2a and/or the second surface 2b. In other words, the first surface 2a and/or the second surface 2b may each define the bottom surface of the recess.

The first surface 2a and/or the second surface 2b may each have a mount area on which an electronic device 10 is mountable. The mount area may receive at least one electronic device 10, and may be appropriately defined as an area inward from the outermost peripheries of the electrode pads 3 (described later) or as an area used for attaching the lid 12 or a larger area. The mount area may receive components other than the electronic device 10. The mount area may receive, for example, an electronic component 23 (described later), and may receive any number of electronic devices 10 and/or electronic components 23.

Although the substrate 2 includes multiple insulating layers in the examples shown in FIGS. 1A to 2B, the substrate 2 may be a single layer, such as a molded layer or a layer pressed with a die. The insulating layers to be the substrate 2 are formed from, for example, an electrical insulating ceramic material or a resin.

Examples of the electrical insulating ceramic material used for the insulating layers forming the substrate 2 include sintered aluminum oxide, sintered mullite, sintered silicon carbide, sintered aluminum nitride, sintered silicon nitride, and sintered glass ceramic. Examples of the resin used for the insulating layers forming the substrate 2 include a thermoplastic resin, an epoxy resin, a polyimide resin, an acryl resin, a phenolic resin, and a fluorine-based resin. Examples of the fluorine-based resin include a polytetrafluoroethylene resin.

The substrate 2 may include seven insulating layers as shown in FIG. 1B or may include six or less insulating layers or eight or more insulating layers. The use of six or less layers reduces the thickness of the electronic device mounting board 1. The use of eight or more layers increases the rigidity of the electronic device mounting board 1. The insulating layers may have openings with different sizes. The openings may define a step, on which electrodes other than the electrode pads 3 may be placed.

The electronic device mounting board 1 has an outermost perimeter with a length of, for example, 0.3 mm to 10 cm on one side, and may be rectangular or square when it is quadrangular in a plan view. The electronic device mounting board 1 has a thickness of, for example, at least 0.2 mm.

The substrate 2 in the electronic device mounting board 1 has the first recess 5 on the first surface 2a and the second recess 6 on the second surface 2b.

The second recess 6 may receive a semiconductor device 11 or another semiconductor device, and may be high enough to accommodate such components in a cross-sectional view. The first recess 5 may be high enough to accommodate at least the electrode pads 3 in a cross-sectional view. The first recess 5 may have substantially as high as each electrode pad 3 or may be high enough to receive the electronic components 23 bonded to the electrode pads 3. When the substrate 2 has two or more second recesses 6, each second recess 6 may receive a different semiconductor device 11 or another semiconductor device. When the substrate 2 has two second recesses 6, each second recess 6 may have a different depth. The first recess 5 and the second recess 6 may have the same depth or different depths in a cross-sectional view.

The electronic device mounting board 1 includes the electrode pads 3 on the substrate 2. The electrode pads 3 are electrically connected to, for example, the electronic device 10 and/or the electronic components 23.

The electronic device mounting board 1 may include electrodes for connection to external circuits on the upper surface, side surfaces, or lower surface of the substrate 2. The electrodes for connection to external circuits may electrically connect the substrate 2 or the electronic package 21 to external circuit boards.

In addition to the electrode pads 3 and/or the electrodes for connection to external circuits, the substrate 2 may also include electrodes between the insulating layers, inner wire conductors, and feedthrough conductors that vertically connect the inner wire conductors on its upper surface or lower surface. The electrodes, the inner wire conductors, or the feedthrough conductors may be uncovered on the surface of the substrate 2. The electrodes, the inner wire conductors, or the feedthrough conductors may electrically connect the electrode pads 3 and/or the electrodes for connection to external circuits.

When the insulating layers are formed from an electrical insulating ceramic material, the electrode pads 3, the electrodes for connection to external circuits, the electrodes, the inner wire conductors, and/or the feedthrough conductors are formed from tungsten (W), molybdenum (Mo), manganese (Mn), palladium (Pd), silver (Ag), or copper (Cu), or an alloy containing one or more of these metals. These components may be formed from copper (Cu). When the insulating layers are formed from a resin, the electrode pads 3, the electrodes for connection to external circuits, the inner wire conductors, and/or the feedthrough conductors may be formed from copper (Cu), gold (Au), aluminum (Al), nickel (Ni), molybdenum (Mo), palladium (Pd), or titanium (Ti), or an alloy containing one or more of these metals.

The uncovered surfaces of the electrode pads 3, the electrodes for connection to external circuits, the electrodes, the inner wire conductors, and/or the feedthrough conductors may further be plated. The plating layer protects the surfaces of the electrodes for connection to external circuits, conductor layers, and the feedthrough conductors against oxidation. The plating layer also improves the electrical connection between the electrode pads 3 and the electronic device 10 with electronic device connections 13, such as bonding wires. The plating layer may be, for example, a Ni plating layer with a thickness of 0.5 to 10 μm, and the Ni plating layer may further be coated with a gold (Au) plating layer with a thickness of 0.5 to 3 μm.

The electrode pads 3 are located in the first recess 5 in the electronic device mounting board 1. An electronic device mounting board to receive an electronic device and/or an electronic component on its front and back surfaces may include electrode pads on the front and back surfaces. Mounting the electronic component or the electronic device includes placing either the electrode pads on the front surface or the electrode pads on the back surface on a fixture or another tool. The electrode pads may be damaged and may cause defective mounting of the electronic component or the electronic device, such as defective bonding to the electronic device connections or lower bonding strength.

In the present embodiment, the electrode pads 3 are located in the first recess 5 and are thus less likely to come in contact with a fixture or another tool. This structure reduces damage on the electrode pads 3, and thus reduces defective mounting of the electronic device 10 or the electronic components 23 on the electrode pads 3.

The substrate 2 in the electronic device mounting board 1 has the first recess 5 located separate from the second recess 6 in a plan view. In a plan view, the first recess 5 may be at about 50 to 300 μm from the second recess 6. The substrate 2 with the first recess 5 at 100 μm or less from the second recess 6 can have a smaller size and maintain high strength. The substrate 2 with the first recess 5 at 100 μm or more from the second recess 6 can provide more space for other components and wires and have higher strength.

Electronic device mounting boards have recently been thinner in response to a demand and include thinner substrates. Thus, the substrate having a first recess and a second recess overlapping each other as viewed from above can have a smaller thickness in a cross-sectional view. The substrate may thus crack or break under pressure applied during bonding of the electronic device connections (described later) or the electronic component to the electrode pads located in the first recess.

In the present embodiment, the substrate 2 has the first recess 5 located separate from the second recess 6 in a plan view. The first recess 5 on the first surface 2a thus avoids overlapping the second recess 6 on the second surface 2b as viewed from above. This reduces the surface area of a partially thinner portion of the electronic device mounting board 1. The substrate 2 is thus less likely to crack or break under pressure applied during bonding of the first connections 13 (described later) for connecting the electronic device or the electronic components 23 to the electrode pads 3 located in the first recess 5.

The above structure reduces damage on the electrode pads 3 and improves the mountability of the electronic device 10 and/or the electronic components 21 on the first surface 2a and the second surface 2b of the electronic device mounting board 1, while reducing cracks or breaks in the substrate 2.

The first recess 5 may have side walls formed by an insulating layer 2c. The side walls of the first recess 5 are the inner walls defining the first recess 5. The first recess 5 having the side walls formed by the insulating layer 2c can be deep. This structure reduces damage on the electrode pads 3 further.

The insulating layer 2c forming the first recess 5 may include the same material as or a different material from other insulating layers used in the substrate 2. The insulating layer 2c may be sintered with the other insulating layers in the substrate 2. In this case, the insulating layer 2c is less likely to come off the other insulating layers in the substrate 2. This structure further reduces damage on the electrode pads 3 resulting from the coming off of the insulating layer 2c.

In the example shown in FIGS. 1A and 1B, the first recess 5 is smaller than the second recess 6 in a plan view. This structure further reduces an area of overlap between the first recess 5 on the first surface 2a and the second recess 6 on the second surface 2b in a plan view. The substrate 2 is thus less likely to crack or break under pressure applied during bonding of the first connection 13 (described later) or the electronic components 23 to the electrode pads 3 located in the first recess. The smaller first recess 5 can reduce the surface area of a partially thinner portion of the structure in a cross-sectional view despite having a larger second recess 6. The second recess 6 can receive a larger semiconductor device 11 or more semiconductor devices 11. This structure thus allows the electronic package 21 to be smaller and have high functionality while reducing cracks or breaks in the electronic device mounting board 1.

The electronic device mounting board 1 in the examples shown in FIGS. 1A to 2B includes multiple first recesses 5. Although two first recesses 5 are shown in FIGS. 1A to 2B, the electronic device mounting board 1 may include three or more first recesses 5. The multiple first recesses 5 can receive the electrode pads 3 for connection to the electronic device 10 and/or to the electronic components 23 at multiple different positions. This structure produces the advantageous effects of the present embodiment and allows the electronic device 10 to have more terminals. The electronic package 21 can thus have high functionality. This structure also increases the areas in which the electronic component 23 is mountable, and extends the functionality of the electronic package 21.

The electronic device mounting board 1 may have multiple first recesses 5 arranged symmetrically to each other about a center point of the substrate 2 in a plan view. This structure allows, during bonding of the first connections 13 (described later) or the electronic components 23 to the electrode pads 3 located in the first recesses 5, applied pressure to be distributed symmetrically about the center point of the substrate 2. The substrate 2 can thus have less deformation and thus less cracks or breaks.

As in the example shown in FIGS. 2A and 2B, the second recess 6 in the electronic device mounting board 1 may have an internal wall 6a. The second recess 6 with the internal wall 6a serves as multiple second recesses 6 divided by the internal wall 6a. Although the single second recess 6 is shown in FIGS. 1A to 2B, the electronic device mounting board 1 may include two or more second recesses 6 with a part between the second recesses 6 referred to as the internal wall 6a.

For example, the second recess 6 may receive multiple semiconductor devices 11 for processing signals from the electronic device 10. In this case, the second recess 6 may have a larger area as viewed from above. This may cause deformation of the electronic device mounting board 1 during fabrication. The bottom surface of the second recess 6 may also deform and cause cracks or breaks in the substrate 2 during mounting of the electronic device 10 or the semiconductor device 11.

In the present embodiment, the internal wall 6a in the second recess 6 can support the bottom surface of the second recess 6. For a larger second recess 6 receiving multiple semiconductor devices 11, the structure reduces deformation of the electronic device mounting board 1 during fabrication or deformation of the bottom surface of the second recess 6 during mounting of the electronic device 10 or the semiconductor device 11. The substrate 2 is thus less likely to crack or break.

As shown in FIGS. 1A to 5, the first recess 5 may be less deep than the second recess 6. In this case as well, the first recess 5 deep enough to accommodate the electrode pads 3 as described above can produce the advantageous effects of the present embodiment.

The electrode pads 3 having the upper surfaces located lower than the upper end of the first recess 5 (toward the lower surface or the second surface) are less likely to come in contact with a fixture or another tool. This structure reduces damage on the electrode pads 3 further. The first recess 5 having a depth greater than the thickness of the electrode pads 3 can receive electrode pads 3 thicker due to errors in fabricating the first recess 5 and the electrode pads 3. This structure also lowers the likelihood that the electrode pads 3 come in contact with the fixture or another tool.

Figure 4A:
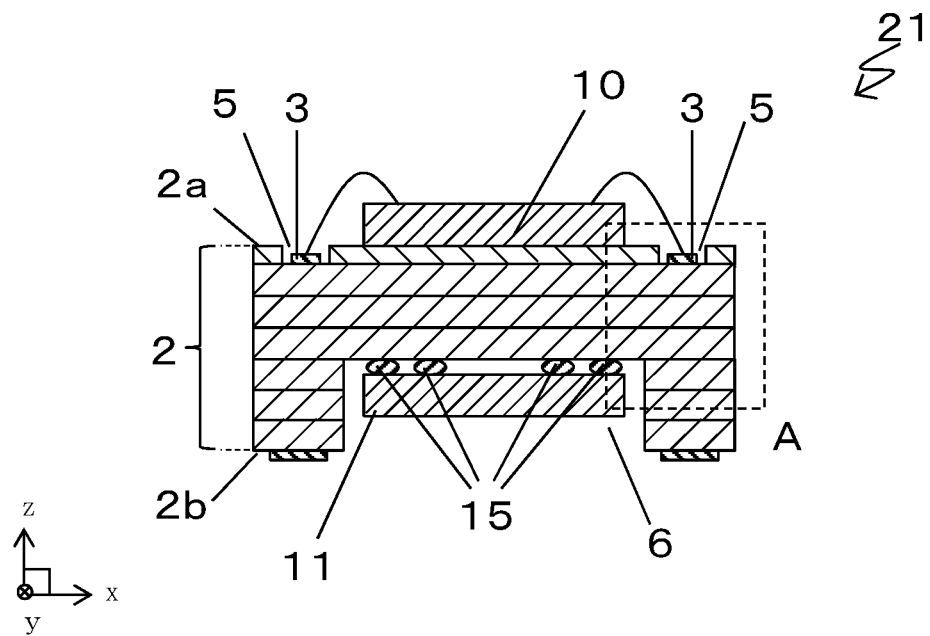
FIG. 4A is a cross-sectional view of an electronic device mounting board and an electronic package according to a modification of the first embodiment of the present invention.
Figure 4B:
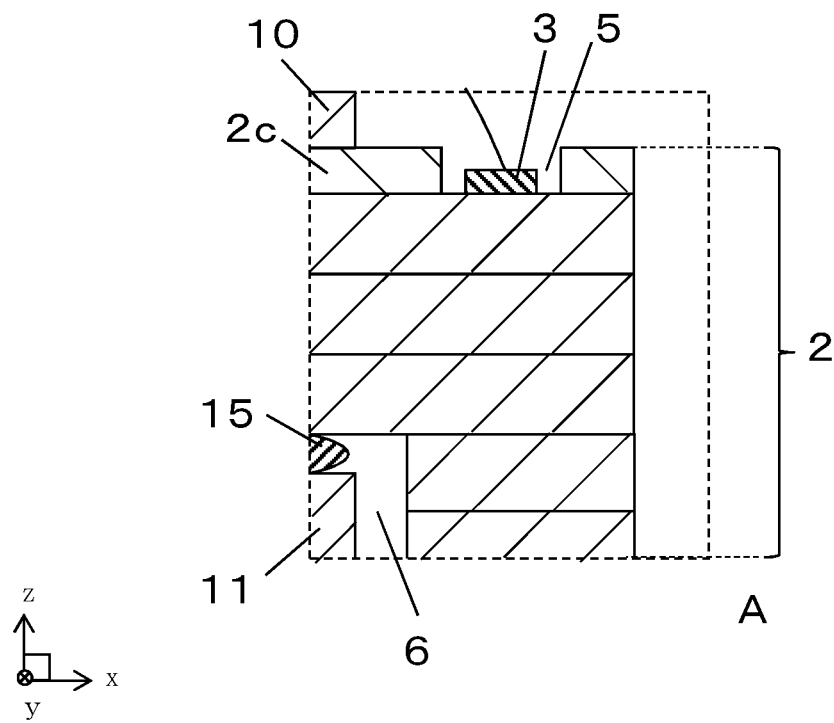
FIG. 4B is an enlarged view of a main part A in FIG. 4A.

FIGS. 4A to 5 are cross-sectional views of the electronic device mounting board 1 and enlarged views of the main part A in the cross-sectional views.

The electrode pads 3 may be located in an isolated manner in the middle of the first recess 5 as in the example shown in FIG. 4B or may be continuous from an inner portion of a layer in (or from inside) the substrate 2 as in the example shown in FIG. 5.

The electrode pads 3 located in an isolated manner in the middle of the first recess 5 as in the example shown in FIG. 4B can produce the advantageous effects of the present embodiment. The electrode pads 3 located in an isolated manner in the middle of the first recess 5 can provide a larger area for bonding the electrode pads 3 and the first connections 13 despite errors in fabricating the first recess 5 and the electrode pads 3. The electrode pads 3 can be electrically connected to, for example, electrodes for connection to external circuits through, for example, the feedthrough conductors.

The electrode pads 3 continuous from an inner portion of a layer in (or from inside) the substrate 2 as in the example shown in FIG. 5 can produce the advantageous effects of the present embodiment. This structure also increases the surface area of the electrode pads 3. The structure provides a larger area for bonding the electrode pads 3 and the first connections 13, which connect the electrode pads 3 to the electronic device 10, and improves the mountability of the electronic device 10. The electrode pads 3 partially functioning as inner wires can be connected to the feedthrough conductors outside the space for bonding the electronic device connections 13 and the electrode pads 3 (or inside the substrate 2). Thus, the structure improves the flatness of the area for bonding the electronic device connections 13 and the electrode pads 3, and improves the mountability of the electronic device 10.

Electronic Package Structure

FIGS. 1A to 2B show examples of the electronic package 21. The electronic package 21 includes the electronic device mounting board 1 and the electronic device 10 mounted on the upper or lower surface of the electronic device mounting board 1.

The electronic package 21 includes the electronic device mounting board 1 and the electronic device 10 mounted on the electronic device mounting board 1. Examples of the electronic device 10 include an imaging device such as a charge-coupled device (CCD) or a complementary metal-oxide semiconductor (CMOS) device, a light-emitting device such as a light-emitting diode (LED), a device for sensing pressure, air pressure, or acceleration, or a gyro sensor, and an integrated circuit. The electronic device 10 may be mounted on the upper surface of the substrate 2 with an adhesive. The adhesive is, for example, silver epoxy or a thermosetting resin.

The electronic device 10 may be electrically connected to the electronic device mounting board 1 with the electronic device connection 13 including, for example, bonding wires, solder balls, and gold bumps.

The electronic package 21 may include the lid 12 that covers the electronic device 10 and is bonded to the upper surface of the electronic device mounting board 1. In this structure, the electronic device mounting board 1 may have the lid 12 bonded to the upper surface of a frame portion in the substrate 2 or may include a frame that supports the lid 12 and surrounds the electronic device 10 on the upper surface of the substrate 2. The frame and the substrate 2 may be formed from the same material or different materials.

The frame and the substrate 2 formed from the same material may be integrated with the uppermost insulating layer by, for example, forming the frame opening in the substrate 2. In another example, the frame and the substrate 2 may be bonded together with a separately prepared brazing material.

When the substrate 2 and the frame are formed from different materials, the frame may be formed from, for example, the same material as the material for a lid bond 14 for bonding the lid 12 to the substrate 2. In this case, the lid bond 14 is thick enough to function both as a bonding member and a frame (as the support for the lid 12). Examples of the lid bond 14 include a thermosetting resin and a brazing material formed from glass with a low melting point or a metal component. The frame and the lid 12 may be formed from the same material. In this case, the frame and the lid 12 may be formed as one piece.

The lid 12 is formed from, for example, a highly transparent material such as a glass material for, for example, an imaging device used as the electronic device 10, such as a CMOS or CCD, or a light-emitting device, such as an LED. The lid 12 may be formed from a metal material, a ceramic material, or an organic material when, for example, the electronic device 10 is an integrated circuit.

The lid 12 is bonded to the electronic device mounting board 1 with the lid bond 14. Examples of the material for the lid bond 14 include a thermosetting resin and a brazing material formed from glass with a low melting point or a metal component.

The electronic package 21 may include the semiconductor device 11 located in the second recess 6 on the second surface 2b. Examples of the semiconductor device 11 include a device for sensing pressure, air pressure, or acceleration, or a gyro sensor, an integrated circuit for processing, and a memory. The semiconductor device 11 may be mounted on the lower surface (second surface 2b) of the substrate 2 with an adhesive. The adhesive is, for example, silver epoxy or a thermosetting resin.

The semiconductor device 11 may be electrically connected to the electronic device mounting board 1 with a second connection 15 including, for example, bonding wires, solder balls, and gold bumps for connecting the semiconductor device.

The electronic package 21 may include a lid that covers the semiconductor device 11 and is bonded to the lower surface (second surface 2b) of the electronic device mounting board 1. The lid may be replaced with, for example, an external circuit.

The electronic package 21 includes the electronic device mounting board 1 shown in FIGS. 1A to 2B, and thus improves the mountability of the electronic device 10. The electronic device mounting board 1 is less likely to crack or break during fabrication of the electronic package 21.

Structure of Electronic Module

FIGS. 3A and 3B show an example of the electronic module 31 including the electronic device mounting board 1. The electronic module 31 includes the electronic package 21 and a housing 32 covering the upper surface of the electronic package 21 or covering the electronic package 21. In the example described below, the electronic module 31 is, for example, an imaging module.

The electronic module 31 may include the housing 32 (lens holder). The housing 32 improves hermetical sealing and reduces external stress directly applied to the electronic package 21. The housing 32 is formed from, for example, a resin or a metal material. The lens holder as the housing 32 may incorporate one or more lenses formed from, for example, a resin, a liquid, glass, or quartz. The housing 32 may include, for example, a drive for vertical or horizontal driving, and may be electrically connected to, for example, the pads on the surface of the electronic device mounting board 1 with a bond such as solder.

The housing 32 may have an opening in at least one of the four sides as viewed from above. Through the opening in the housing 32, an external circuit board may be placed for electrical connection to the electronic device mounting board 1. After the external circuit board is electrically connected to the electronic device mounting board 1, the opening in the housing 32 may be sealed with a sealant, such as a resin, to fill a gap at the opening and hermetically seal the inside of the electronic module 31.

The electronic module 31 includes the electronic device mounting board 1 shown in FIGS. 3A and 3B, and thus improves the mountability of the electronic device 10. The electronic device mounting board 1 is less likely to crack or break during fabrication of the electronic package 21 or the electronic module 31.

Method for Manufacturing Electronic Device Mounting Board and Electronic Package An example method for manufacturing the electronic device mounting board 1 and the electronic package 21 according to the present embodiment will now be described. The manufacturing method for the substrate 2 described below uses a multi-piece wiring substrate.

(1) A ceramic green sheet that is to be the substrate 2 is prepared first. To obtain the substrate 2 formed from, for example, sintered aluminum oxide ($Al_2O_3$), powders, such as silica ($SiO_2$), magnesia (MgO), or calcium oxide (CaO), are added as sintering aids to $Al_2O_3$ powder, and an appropriate binder, an appropriate solvent, and an appropriate plasticizer are added to the powder mixture, which is then kneaded to form slurry. The slurry is then shaped into a sheet using a doctor blade or by calendaring to obtain a ceramic green sheet for a multi-piece substrate.

The substrate 2 formed from, for example, a resin may be molded using a mold having a predetermined shape by transfer molding or injection molding, or by pressing using a die. The substrate 2 may be formed from a glass epoxy resin, which is a base glass fiber impregnated with a resin. In this case, the base glass fiber is impregnated with a precursor of an epoxy resin. The epoxy resin precursor is then cured by heat at a predetermined temperature to form the substrate 2.

(2) A metal paste is then applied or placed, by screen printing or other techniques, to the areas to be the electrode pads 3, the electrodes for connection to external circuits, the inner wire conductors, and the feedthrough conductors in the ceramic green sheet obtained through the above process (1). The metal paste is prepared by adding an appropriate solvent and an appropriate binder to the metal powder containing the above metal materials and then kneading the mixture to have an appropriate viscosity. The metal paste may contain glass or ceramic to increase the bonding strength with the substrate 2.

When the substrate 2 is formed from a resin, the electrode pads 3, the electrodes for connection to external circuits, the inner wire conductors, and the feedthrough conductors can be fabricated by, for example, sputtering or vapor deposition. In some embodiments, these components may be fabricated by plating after forming a metal film on the surface.

(3) The green sheet is then processed using, for example, a die. In this process, an opening or a notch may be formed in a predetermined portion of the green sheet to be the substrate 2. Also, the first recess 5 and the second recess 6 may be formed at predetermined positions of the green sheet using a die or laser, or by punching.

In this process, the green sheet may be processed to form recesses, or holes and openings to be the first recess 5 and the second recess 6 on the substrate 2 using, for example, a die. The recesses may align with pads.

(4) The ceramic green sheets to be the insulating layers forming the substrate 2 are then stacked and pressed. The green sheets to be the insulating layers may then be stacked to fabricate a ceramic green sheet laminate to be the substrate 2 (electronic device mounting board 1). This process may also include forming recesses (or openings) to be the first recess 5 and the second recess 6 at predetermined positions of the stacked ceramic green sheets using a die or laser, or by punching. In some embodiments, multiple ceramic green sheets with through-holes at positions to be the first recess 5 and the second recess 6 may be prepared and stacked on one another to form the first recess 5 and the second recess 6 defined by the multiple layers.

(5) The ceramic green sheet laminate is then fired at about 1,500 to 1,800° C. to obtain a multi-piece wiring substrate including an array of substrates 2 (electronic device mounting boards 1). In this process, the metal paste described above is fired together with the ceramic green sheet to be the substrate 2 (electronic device mounting board 1) to form the electrode pads 3, the electrodes for connection to external circuits, the inner wire conductors, and the feedthrough conductors.

(6) The multi-piece wiring substrate resulting from the firing process is then cut into multiple substrates 2 (electronic device mounting boards 1). In this cutting process, separation grooves may be formed along the outer edge of each of the substrates 2 (electronic device mounting boards 1), and the multi-piece wiring substrate may be split along the separation grooves into the multiple substrates 2 (electronic device mounting boards 1). In other embodiments, the multi-piece wiring substrate may be cut along the outer edge of each of the substrates 2 (electronic device mounting boards 1) by, for example, slicing. The separation grooves may be formed to have a depth smaller than the thickness of the multi-piece wiring substrate using a slicer after the firing process. In still other embodiments, the separation grooves may be formed by pressing a cutter blade onto the ceramic green sheet laminate that is to be the multi-piece wiring substrate or by cutting the ceramic green sheet laminate to a depth smaller than its thickness with a slicer. Before or after the multi-piece wiring substrate is split into multiple substrates 2 (electronic device mounting boards 1), the electrode pads 3, the pads for external connection, and the uncovered wiring conductors may be plated by electroplating or electroless plating.

(7) The electronic device 10 is mounted on the first surface 2a of the electronic device mounting board 1, and the semiconductor device 11 is mounted on the second surface 2b of the electronic device mounting board 1. The electronic device 10 is electrically connected to the electronic device mounting board 1 with the electronic device connections 13, such as bonding wires. The electronic device 10 may be fixed onto the electronic device mounting board 1 with an adhesive or another bond applied to the electronic device 10 or to the electronic device mounting board 1. After the electronic device 10 is mounted on the electronic device mounting board 1, the lid 12 may be bonded to the electronic device mounting board 1 with the lid bond 14.

The electronic package 21 is obtained by fabricating the electronic device mounting board 1 and mounting the electronic device 10 on the electronic device mounting board 1 through the processes (1) to (7). The processes (1) to (7) may be performed in any order that enables intended processing.

Second Embodiment

An electronic package 21 and an electronic device mounting board 1 according to a second embodiment of the present invention will now be described with reference to FIGS. 6A and 6B. In the present embodiment, FIG. 6B is an enlarged cross-sectional view of a main part B of the electronic device mounting board 1.

The electronic device mounting board 1 includes a substrate 2 having a first surface 2a and a second surface 2b opposite to the first surface. The substrate 2 has a first recess 5 on the first surface 2a and a second recess 6 on the second surface 2b. The substrate 2 includes electrode pads 3. The electrode pads 3 are located in the first recess 5. In a plan view, the substrate 2 has the electrode pads 3 (portions to be bonded with a first connections 13) located separate from the second recess 6.

The structures of an electronic module 31 and the electronic package 21, and the basic materials, conditions, and structures of the electronic device mounting board 1 including the substrate 2, the electrode pads 3, the first recess 5, the second recess 6, an electronic device 10, a semiconductor device 11, and other components in the present embodiment are similar to those described in the first embodiment, and will not be described. The features in the second embodiment will now be described.

In the electronic device mounting board 1 according to the present embodiment, the substrate 2 has the electrode pads 3 (portions to be bonded with the first connections 13) located separate from the second recess 6 in a plan view.

Electronic device mounting boards have recently been thinner in response to a demand and include thinner substrates. Thus, the substrate having a first recess and a second recess overlapping each other as viewed from above can have a smaller thickness in a cross-sectional view. In particular, the portions of the electrode pads in the first recess to be bonded with electronic device connections may deform greatly under pressure applied during bonding of the electronic device connections or an electronic component. This may cause cracks or breaks in the substrate.

In the present embodiment, the substrate 2 has the electrode pads 3 (portions to be bonded with the first connections 13) located separate from the second recess 6 in a plan view. The electrode pads 3 (portions to be bonded with the first connections 13) thus avoid overlapping the second recess 6 as viewed from above. The portions to be under the most stress when the first connections 13 are connected to the electrode pads 3 are less likely to have the smallest thickness. The substrate 2 is thus less likely to deform greatly. This structure reduces cracks or breaks in the substrate 2.

Figure 6A:
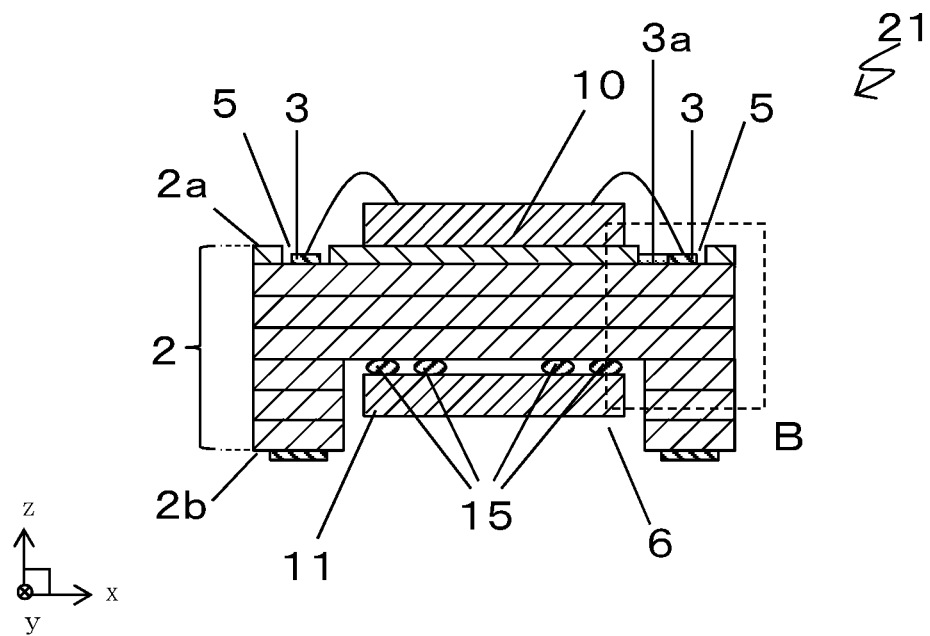
FIG. 6A is an external cross-sectional view of an electronic device mounting board and an electronic package according to a second embodiment of the present invention.
Figure 6B:
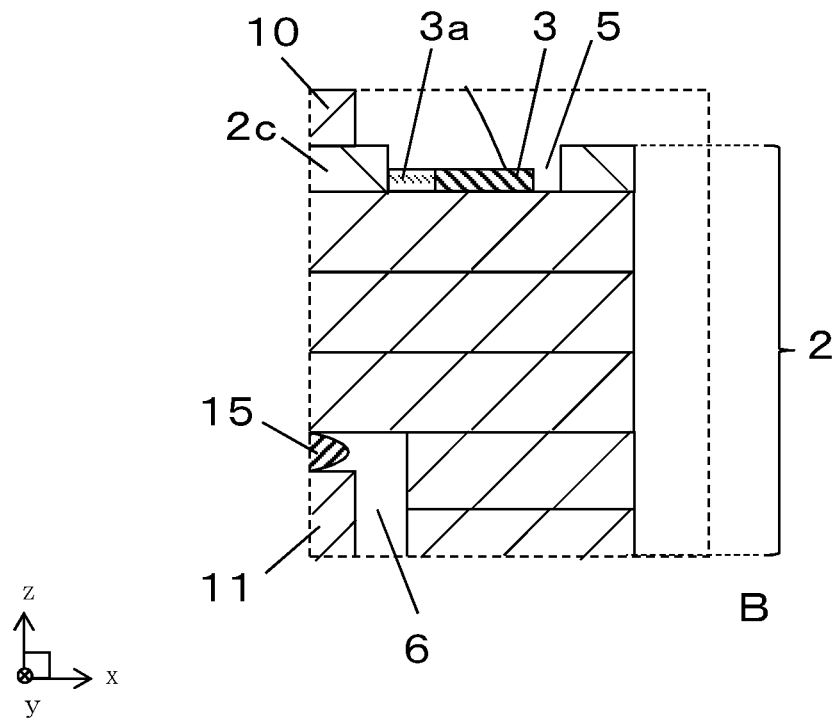
FIG. 6B is an enlarged view of a main part B in FIG. 6A.

As in the example shown in FIGS. 6A and 6B, each electrode pad 3 may include an external part 3a continuous from inside the substrate 2. The external part 3a is not the portion to be bonded with the first connection 13. The portion of the electrode pad 3 to be bonded with the first connection 13 can be located separate from the second recess 6 in a plan view. The portions to be under the most stress when the first connections 13 are connected to the electrode pads 3 are less likely to have the smallest thickness. The substrate 2 is thus less likely to deform greatly. This structure reduces cracks or breaks in the substrate 2.

The electronic device mounting board 1 may have the first recess 5 smaller than the second recess 6 in a plan view. This structure further reduces an area of overlap between the first recess 5 on the first surface 2a and the second recess 6 on the second surface 2b as viewed from above. The substrate is thus less likely to crack or break under pressure applied during bonding of the first connections 13 (described later) or electronic components 23 to the electrode pads 3 located in the first recess 5.

The electronic device mounting board 1 may have multiple first recesses 5. The multiple first recesses 5 can receive the electrode pads 3 for connection to the electronic device 10 and/or to the electronic components 23 at multiple different positions. This structure produces the advantageous effects of the present embodiment and allows the electronic device 10 to have more terminals, achieving high functionality. This structure also increases the areas in which the electronic component 23 is mountable, thus achieving high functionality of the electronic package 21.

The second recess 6 in the electronic device mounting board 1 may have an internal wall 6a. The second recess 6 with the internal wall 6a serves as multiple second recesses 6 divided by the internal wall 6a. The internal wall 6a in the second recess 6 can support the second recess 6. This structure reduces deformation of the electronic device mounting board 1 during fabrication or deformation of the bottom surface of the second recess 6 during mounting of the electronic device 10 or the semiconductor device 11. The substrate 2 is thus less likely to crack or break.

The first recess 5 may be less deep than the second recess 6. In this case as well, the first recess 5 deep enough to accommodate the electrode pads 3 as described above produces the advantageous effects of the present embodiment. The electrode pads 3 having the upper surfaces located lower than the upper end of the first recess 5 (toward the lower surface or the second surface) are less likely to be damaged.

Method for Manufacturing Electronic Device Mounting Board and Electronic Package An example method for manufacturing the electronic device mounting board 1 and the electronic package 21 according to the present embodiment will now be described. The method for manufacturing the electronic device mounting board 1 and the electronic package 21 according to the present embodiment is basically similar to the manufacturing method described in the first embodiment. The method for manufacturing the electronic device mounting board 1 according to the present embodiment includes forming the electrode pads 3 at predetermined positions not overlapping the second recess 6.

Third Embodiment

Figure 7A:
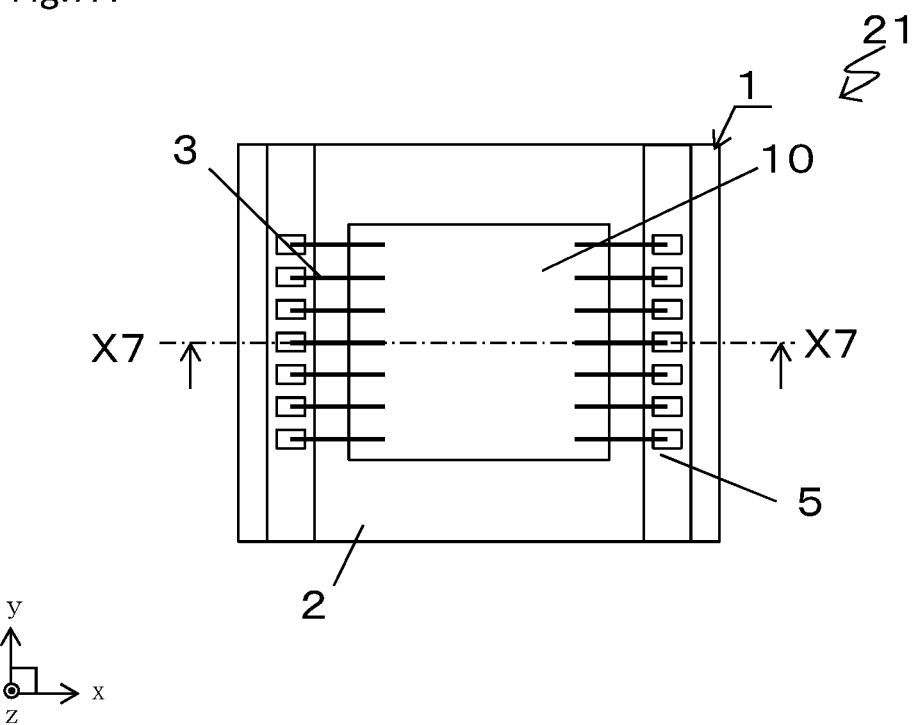
FIG. 7A is an external top view of an electronic device mounting board and an electronic package according to a third embodiment the present invention without showing a lid.
Figure 7B:
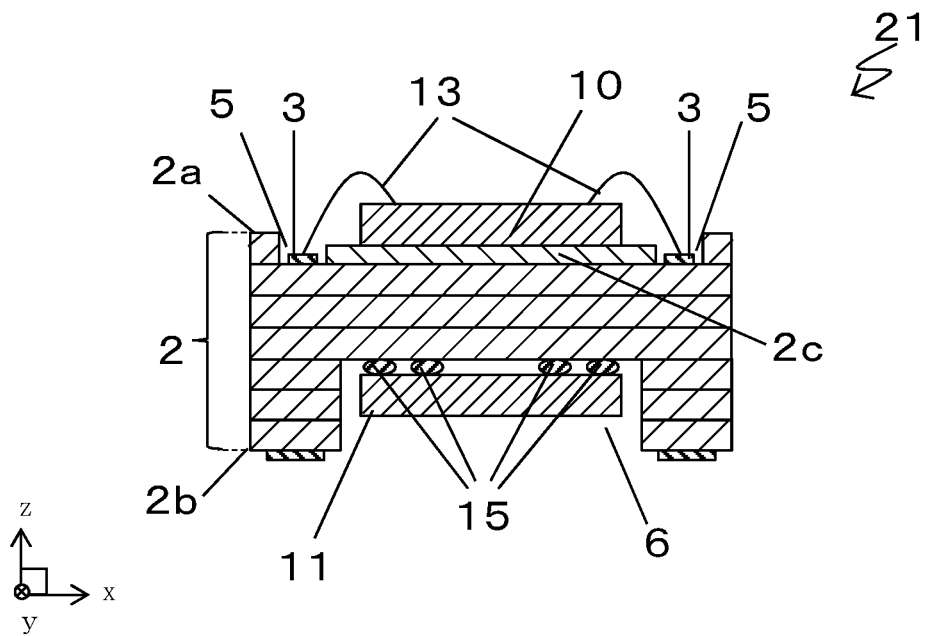
FIG. 7B is a cross-sectional view taken along line X7-X7 in FIG. 7A.

An electronic device mounting board 1 according to a third embodiment of the present invention will now be described with reference to FIGS. 7A and 7B. FIGS. 7A and 7B show the shapes of the electronic device mounting board 1 and an electronic package 21 without a lid 12 according to the present embodiment.

The electronic device mounting board 1 according to the present embodiment differs from the electronic device mounting board 1 according to the first embodiment in that an insulating layer 2c defining a first recess 5 has different thicknesses at the periphery and at the center.

In the example shown in FIGS. 7A and 7B, the first recess 5 in the electronic device mounting board 1 has side walls with different thicknesses at the periphery and at the center in a cross-sectional view. The first recess 5 with such different side wall dimensions is located separate from a second recess 6 in a plan view. The substrate 2 can thus reduce the surface area of a partially thinner portion of the electronic device mounting board 1. The substrate 2 is thus less likely to crack or break under pressure applied during bonding of electrode pads 3 in the first recess 5 and an electronic device 10 and/or electronic components 23 with first connections 13.

The first recess 5 having the side walls has, at the highest position, a height greater than the thickness of the electrode pads 3, thus reducing damage on the electrode pads 3.

The above structure reduces damage on the electrode pads 3 and improves the mountability of the electronic device 10 and/or the electronic components 21 on the front and back surfaces of the electronic device mounting board 1, while reducing cracks or breaks in the substrate 2.

Fourth Embodiment

Figure 8A:
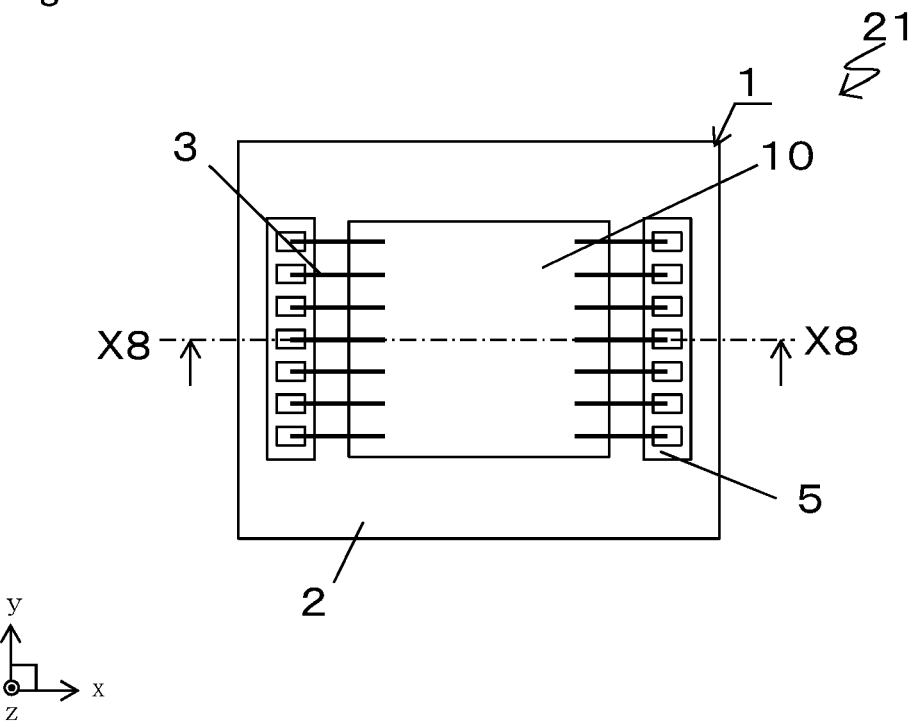
FIG. 8A is an external top view of an electronic device mounting board and an electronic package according to a fourth embodiment the present invention without showing a lid.
Figure 8B:
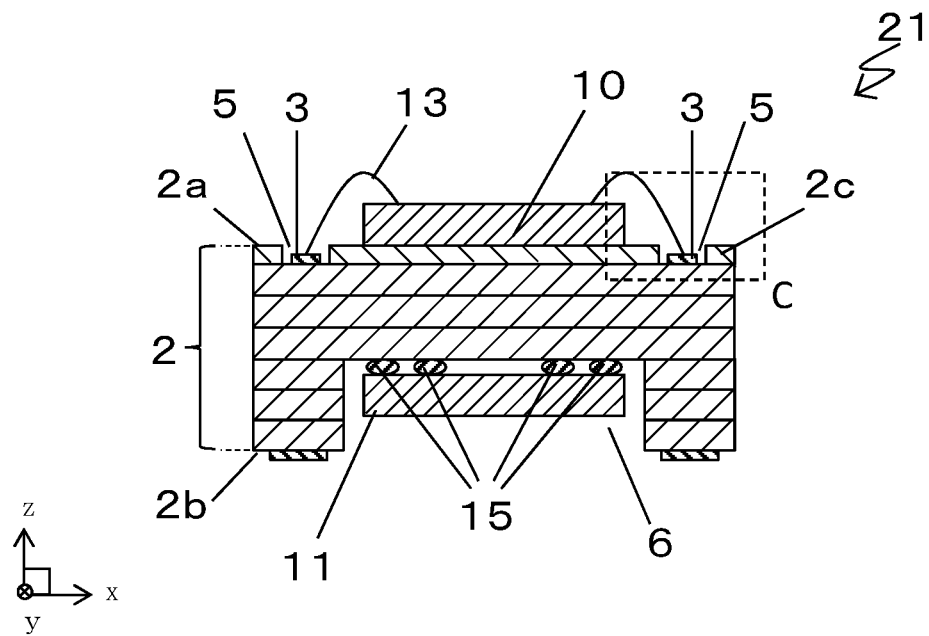
FIG. 8B is a cross-sectional view taken along line X8-X8 in FIG. 8A.

An electronic device mounting board 1 according to a fourth embodiment of the present invention will now be described with reference to FIGS. 8A to 12. FIGS. 8A and 8B show the shapes of the electronic device mounting board 1 and an electronic package 21 without a lid 12 according to the present embodiment. FIGS. 9A to 12 are enlarged views of a main part C in FIG. 8B according to modifications.

In the example shown in FIGS. 8A and 8B, the side surfaces of a first recess 5 are defined by an insulating layer 2c. A substrate 2 formed from, for example, an electrical insulating ceramic material may be a stack of insulating layers 2c of the same material pressed and fired. For the substrate 2 formed from an electrical insulating ceramic material, the insulating layer 2c may be formed from a resin material. A substrate 2 formed from a resin material may include the insulating layer 2c formed from the same material as the substrate 2.

The first recess 5 having the side surfaces defined by the insulating layer 2c can have a uniform depth, thus reducing tilting of the surface of the substrate 2. This may reduce tilting of the first surface placed into contact with a fixture or another tool during mounting of, for example, a semiconductor device 11, thus improving the mountability of an electronic device 10 on the electronic device mounting board 1.

Figure 9A:
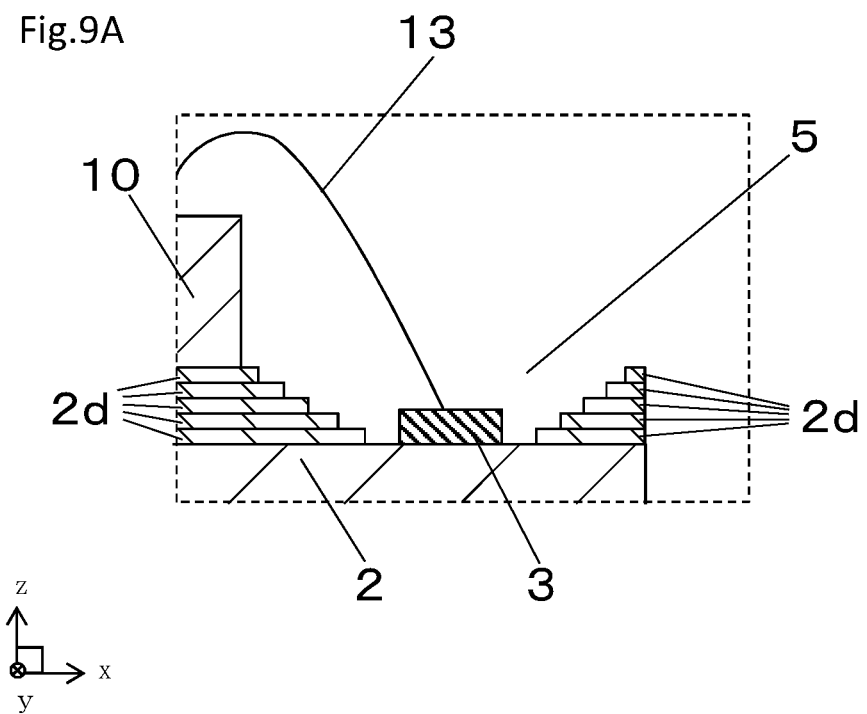
FIGS. 9A and 9B each are an enlarged view of an electronic device mounting board according to a modification of the fourth embodiment of the present invention showing a main part C in FIG. 8B.

As in the example shown in FIG. 9A, the substrate 2 may contain a ceramic material. The first recess 5 may have the side walls including a ceramic coating 2d. In this example as well, the substrate 2 having the first recess 5 located separate from a second recess 6 in a plan view can reduce the surface area of a partially thinner portion of the electronic device mounting board 1. This structure thus reduces cracks or breaks in the substrate 2 under pressure applied during bonding of first connections 13 (described later) or electronic components 23 to the electrode pads 3 located in the first recess 5.

The first recess 5 having the side walls including the ceramic coating 2d eliminates the stacking process or reduces the pressure for stacking as compared with the first recess 5 having the side walls formed by the insulating layer 2c. This structure reduces warpage in the substrate 2 during fabrication.

The first recess 5 having the side walls including the ceramic coating 2d may overlap the second recess 6 in a plan view. However, the electrode pads 3 in the first recess 5 are located separate from the second recess 6 in a plan view. This structure lowers the likelihood that the electrode pads 3 (portions to be bonded with the first connections 13) overlap the second recess 6 as viewed from above. The portions to be under the most stress when the first connections 13 are connected to the electrode pads 3 are less likely to have the smallest thickness. The substrate 2 is thus less likely to deform greatly. This structure reduces cracks or breaks in the substrate 2.

The first recess 5 having the side walls formed by the ceramic coating 2d has, at the highest position, a height greater than the thickness of the electrode pads 3, thus reducing damage on the electrode pads 3. This structure reduces damage on the electrode pads 3 and improves the mountability of the electronic device 10 and/or the electronic components 21 and the semiconductor device 11 on a first surface 2a and a second surface 2b of the electronic device mounting board 1, while reducing cracks or breaks in the substrate 2.

The first recess 5 having the side walls including the ceramic coating 2d may include either a single thick ceramic coating 2d or multiple ceramic coatings 2d stacked together as in the example shown in FIG. 9A to have the ceramic coating 2d with a predetermined thickness (thicker than the electrode pad 3).

The first recess 5 having the side walls formed by a single thick ceramic coating 2d undergoes a single application of the ceramic coating 2d, thus reducing the number of processes.

The first recess 5 having the side walls formed by multiple ceramic coatings 2d stacked together as in the example shown in FIG. 9A undergoes a number of applications of the ceramic coatings 2d to reliably achieve the predetermined thickness.

For the first recess 5 having the side walls including multiple ceramic coatings 2d stacked together, the multiple ceramic coatings may define the opening of the first recess 5 that becomes wider away from the first surface 2a. In other words, the first recess 5 defined by the ceramic coatings 2d may have a stepped potion in a cross-sectional view. This structure lowers the likelihood that the ceramic coating 2d is erroneously applied to a portion to be the first recess 5 in a number of applications of the ceramic coating 2d and fails to have a predetermined space in the first recess 5, or lowers the likelihood that the ceramic coating 2d adheres to the surface of the electrode pads 3. The above structure also lowers the likelihood that the first connections 13 as the wire bonding pads have the distal ends erroneously in contact with a side wall of the first recess 5 and fails to bond to the electrode pads 3 at a predetermined position or lowers the likelihood that the bonding strength is lowered during bonding of the first connections 13 to the electrode pads 3. This improves the mountability of the electronic device 10 on the electronic device mounting board 1.

Figure 9B:
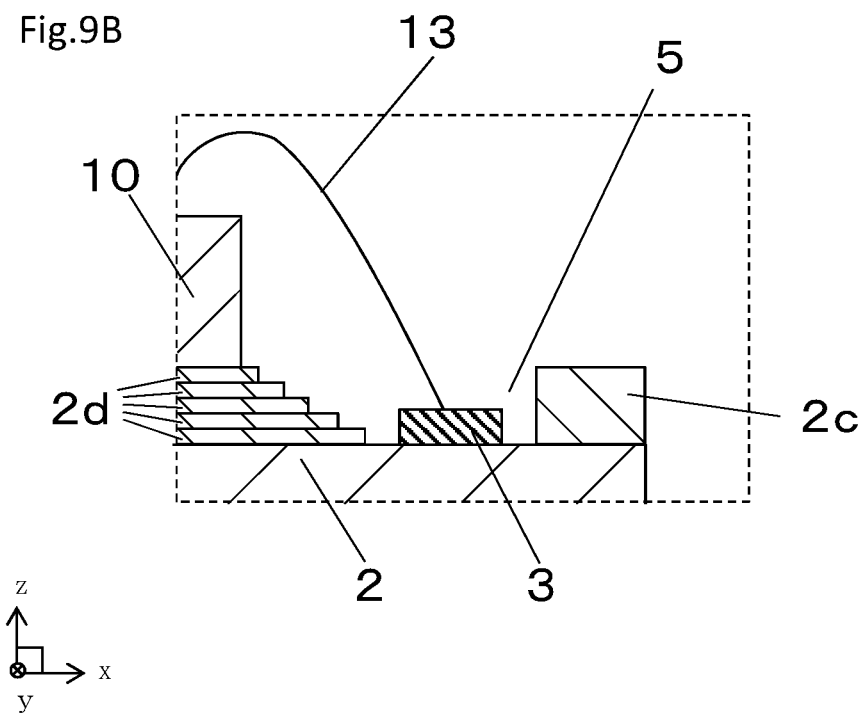

In the example shown in FIG. 9B, the first recess 5 has the side walls including the insulating layer 2c and the ceramic coatings 2d. This structure produces the advantageous effects of each embodiment of the present invention, as well as the advantageous effects of the examples described above. In other words, the first recess 5 that is partially the insulating layer 2c can have a uniform depth, thus reducing tilting of the surface of the substrate 2. This may reduce tilting of the first surface placed into contact with a fixture or another tool during mounting of, for example, the semiconductor device 11.

The first recess 5 having the side walls that are partially the ceramic coatings 2d reduces the pressure for stacking and thus warpage of the substrate 2. The part being the insulating layer 2c may be in the shape of a frame and extend along the entire periphery of the substrate 2. This structure produces the advantageous effects more reliably.

In the examples shown in FIGS. 10A to 11B, the first recess 5 in the electronic device mounting board 1 has a sloped portion in a cross-sectional view. As in the examples shown in FIGS. 10A and 10B, the first recess 5 having a sloped portion in a cross-sectional view with a greater width toward the upper surface lowers the likelihood that the first connections 13 as the wire bonding pads have distal ends erroneously in contact with a side wall of the first recess 5 and fail to bond to the electrode pads 3 at predetermined positions or lowers the likelihood that the bonding strength is lowered during bonding of the first connections 13 to the electrode pads 3. This improves the mountability of the electronic device 10 on the electronic device mounting board 1. As in the examples in FIGS. 11A and 11B, the first recess 5 having a smaller width toward the upper surface in a cross-sectional view lowers the likelihood that a sealing resin used in the recess to reinforce the bonding strength after bonding the electric connections 13 flows onto the surface of the substrate 2. The first recess 5 in these examples also lowers the likelihood that, for example, solder used to mount the electronic components 23 on the electrode pads 3 flows onto the surface of the substrate 2.

Figure 10A:
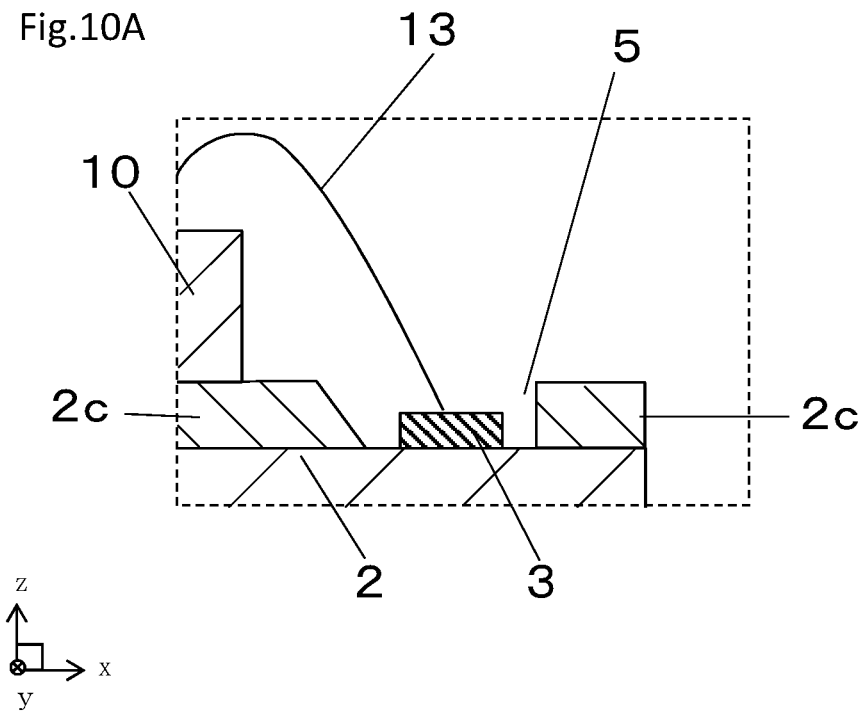
FIGS. 10A and 10B each are an enlarged view of an electronic device mounting board according to a modification of the fourth embodiment of the present invention showing the main part C in FIG. 8B.
Figure 10B:
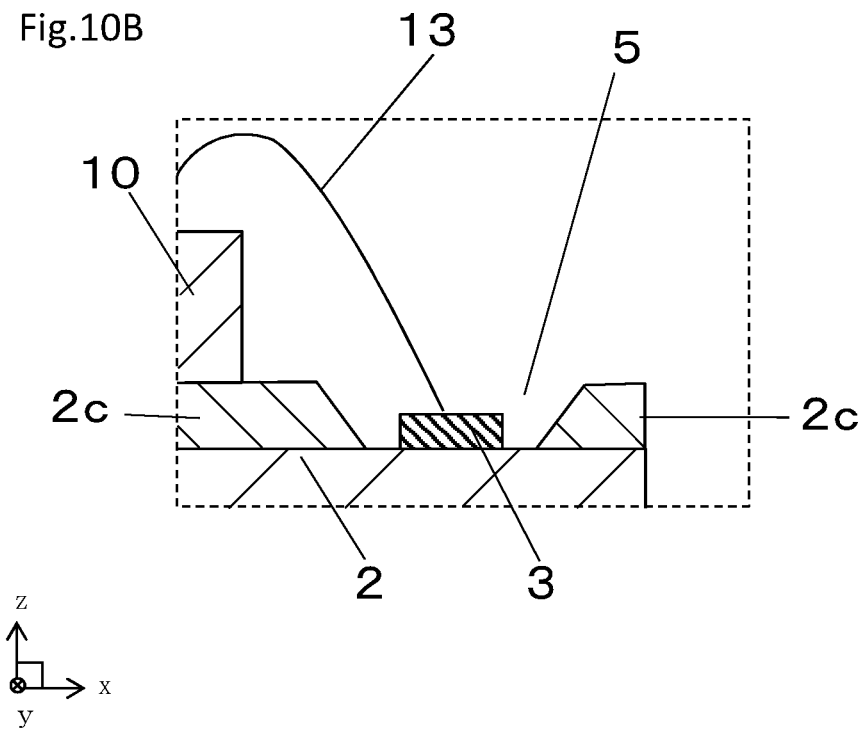
Figure 11A:
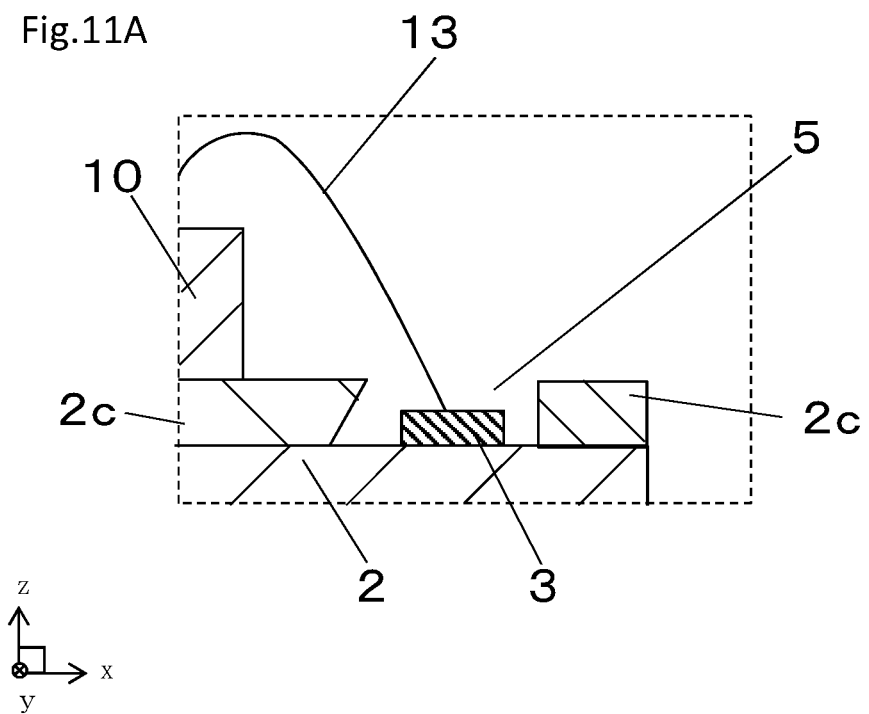
FIGS. 11A and 11B each are an enlarged view of an electronic device mounting board according to a modification of the fourth embodiment of the present invention showing the main part C in FIG. 8B.
Figure 11B:
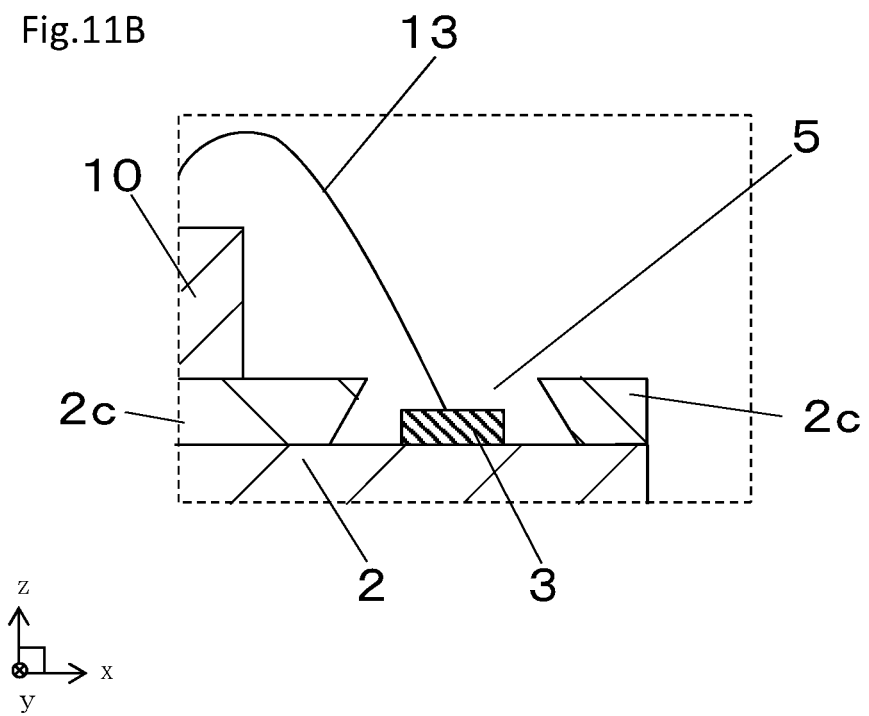

The first recess 5 may have one side sloped in a cross-sectional view as in the examples shown in FIGS. 10A and 11A or may have both sides sloped in a cross-sectional view as in the examples shown in FIGS. 10B and 11B. Any of these examples produces the advantageous effects described above. In particular, the first recess 5 may have a sloped side adjacent to where the electronic device 10 is mounted to produce the above advantageous effects.

The first recess 5 in the electronic device mounting board 1 may have a stepped portion in a cross-sectional view. This structure lowers the likelihood that the first recess 5 fails to have a predetermined space due to errors in, for example, performing a number of applications of the insulating layer 2c or in stacking a number of insulating layers 2c. This structure also lowers the likelihood that the first connections 13 as bonding wires have distal ends erroneously in contact with a side wall of the first recess 5 and fails to bond to the electrode pads 3 at predetermined positions or lowers the likelihood that the bonding strength is lowered during bonding of the first connections 13 to the electrode pads 3. This improves the mountability of the electronic device 10 on the electronic device mounting board 1.

Figure 12:
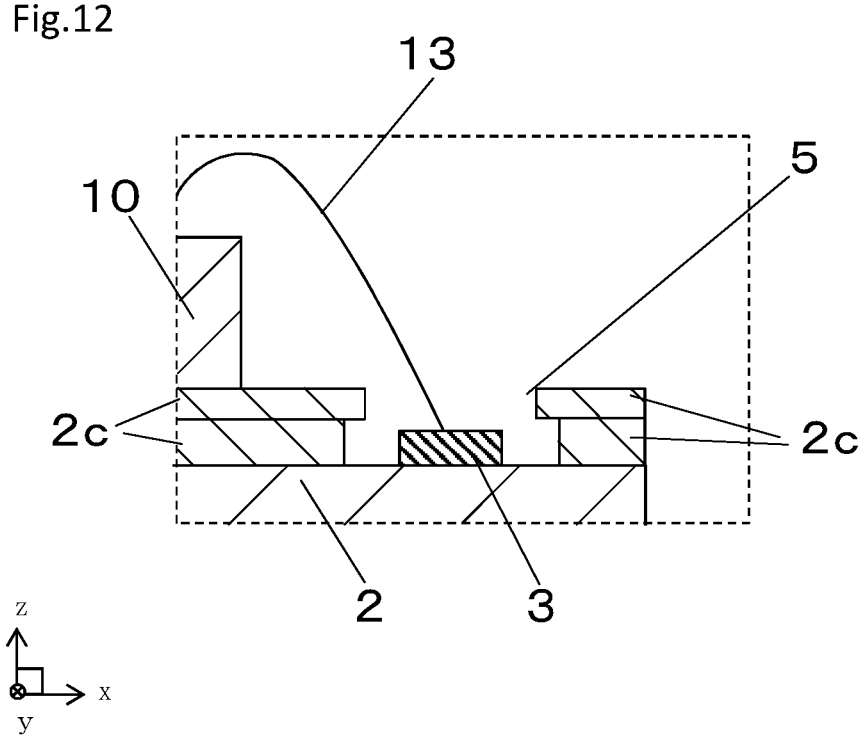
FIG. 12 is an enlarged view of an electronic device mounting board according to a modification of the fourth embodiment of the present invention showing the main part C in FIG. 8B.

In the example shown in FIG. 12, the first recess 5 is defined by multiple insulating layers 2c. In a cross-sectional view, the upper insulating layer 2c has a smaller opening than the lower insulating layer 2c. This structure lowers the likelihood that a sealing resin used in the recess to reinforce the bonding strength after bonding the electric connections 13 flows onto the surface of the substrate 2. The first recess 5 in this example also lowers the likelihood that, for example, solder used to mount the electronic components 23 on the electrode pads 3 flows onto the surface of the substrate 2. This improves the yield in fabricating the electronic package 21 and reduces malfunctions caused by the solder or the sealing resin flowing onto the surface of the substrate 2.

The method for fabricating the first recess 5 having the side surfaces defined by the ceramic coating 2d may include, in addition to, for example the processes in the manufacturing method according to the first embodiment, applying an insulating paste to be the ceramic coating 2d to a predetermined portion by, for example, screen printing and firing the workpiece before and after applying a wiring paste to be the electrode pads 3. The insulating paste may then be pressed from above to improve the bonding strength between the substrate 2 and the ceramic coating 2d.

Fifth Embodiment

Figure 13A:
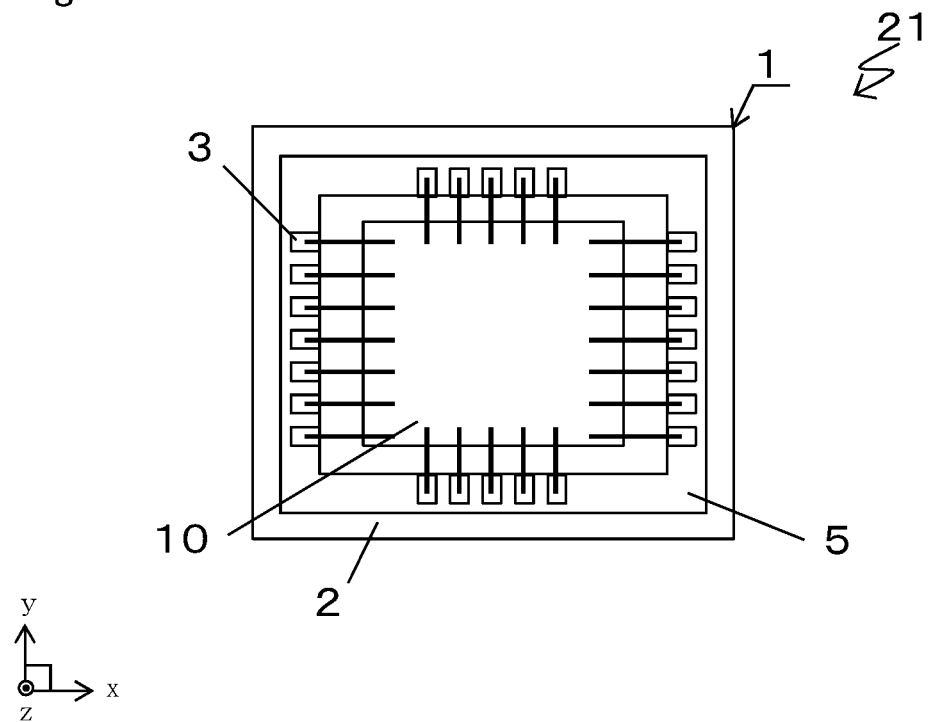
FIG. 13A is an external top view of an electronic device mounting board and an electronic package according to a fifth embodiment of the present invention without showing a lid.
Figure 13B:
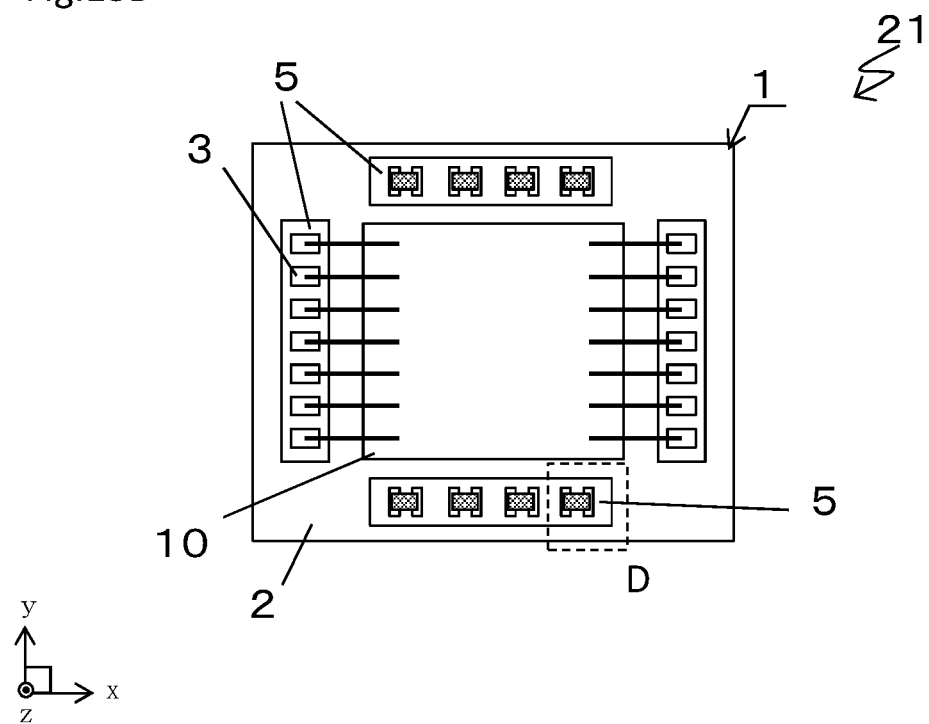
FIG. 13B is an external top view of an electronic device mounting board and an electronic package according to a modification of the fifth embodiment of the present invention without showing a lid.
Figure 14A:
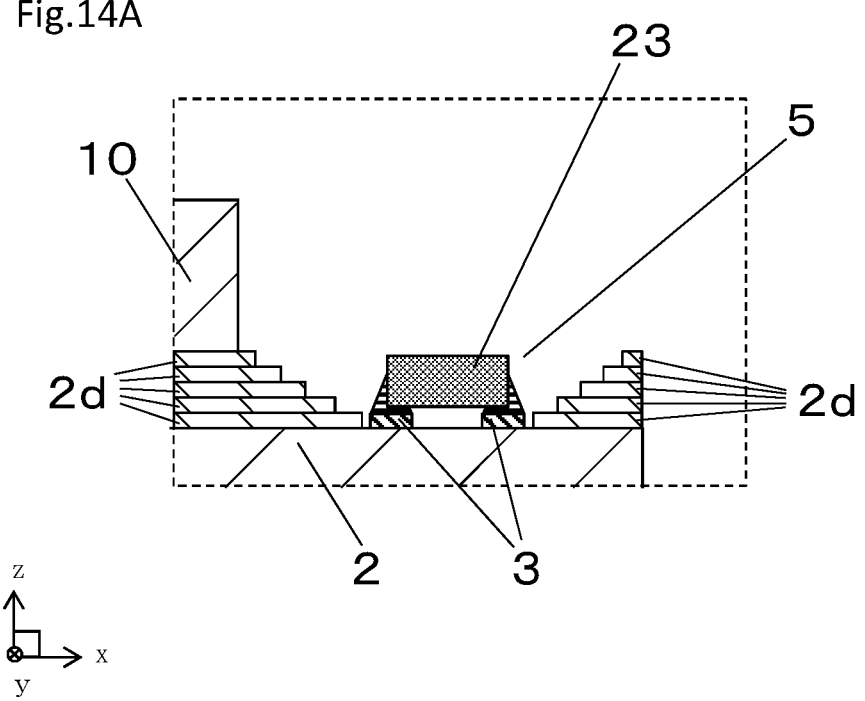
FIGS. 14A and 14B each are an enlarged cross-sectional view of an electronic device mounting board according to a modification of the fifth embodiment of the present invention showing a main part D in FIG. 13B.
Figure 14B:
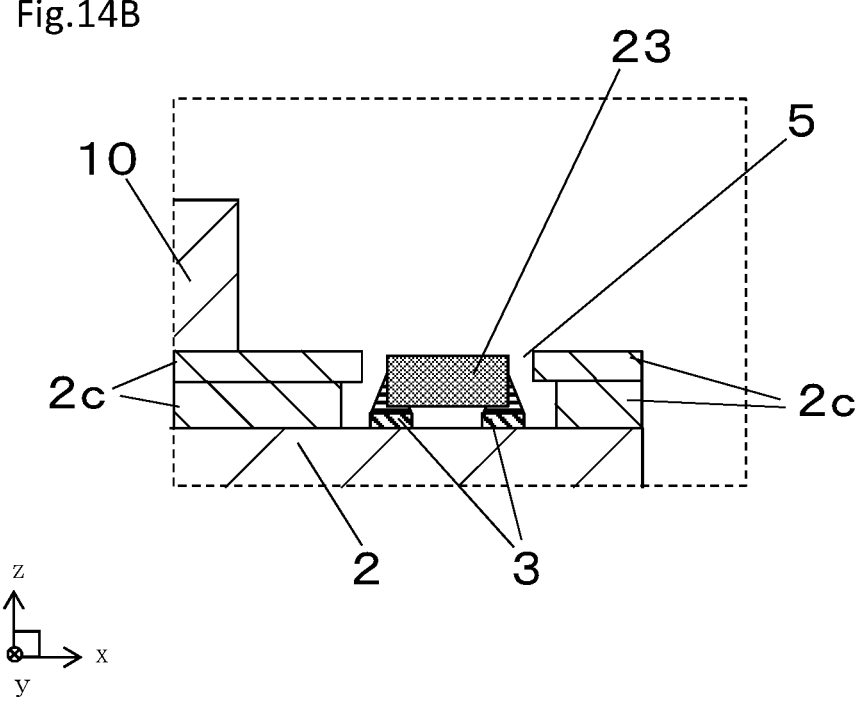

An electronic device mounting board 1 according to a fifth embodiment of the present invention will now be described with reference to FIGS. 13A to 14B. FIGS. 13A and 13B show the shapes of the electronic device mounting board 1 and an electronic package 21 without a lid 12 according to the present embodiment. FIGS. 14A and 14B are enlarged cross-sectional views of a main part D in FIG. 13B according to modifications.

The electronic device mounting board 1 according to the present embodiment differs from the electronic device mounting board 1 according to the first embodiment in the shape of a first recess 5 or in that the first recess 5 receives electronic components 23.

In the example shown in FIG. 13A, the first recess 5 extends in the shape of a frame as viewed from above. This structure also produces the advantageous effects of the embodiments of the present invention. The first recess 5 receives electrode pads 3 on the four sides. This allows for high functionality of the electronic device 10 or increases the design freedom of the electronic device mounting board 1.

In the example shown in FIG. 13A, the substrate 2 may be thicker at the outer perimeter of the first recess 5 than at the inner perimeter of the first recess 5. A first surface 2a of the substrate 2 may thus be fixed to a fixture more stably in mounting, for example, a semiconductor device 11. The first recess 5 being frame-shaped at the highest position can reduce contact of the electrode pads 3 with the fixture, and reduce tilting of the substrate 2 and thus reduce contact of the electrode pads 3 with, for example, the fixture. The electrode pads 3 are thus less likely to be damaged.

In the example shown in FIG. 13B, some of multiple first recesses 5 receive electrode pads 3 that connect to the electronic device 10 with first connections 13, and remaining first recesses 5 receive electrode pads 3 that connect to the electronic components 23. Examples of the electronic components 23 include chip capacitors, resistors, coils, and other small components. In FIG. 13B, the electronic components 23 are chip capacitors.

FIGS. 14A and 14B are enlarged cross-sectional views of the main part D shown in FIG. 13B.

In the example shown in FIG. 14A, the first recess 5 receives the electronic components 23. The first recess 5 has the side surfaces that include steps defined by ceramic coatings 2d or insulating layers 2c. This structure produces the advantageous effect of the embodiments of the present invention and lowers the likelihood that a suction pad or an arm for mounting the electronic components 23 comes in contact with the upper end (side walls) of the first recess 5 and causes mounting misalignment or defective mounting of the electronic components 23.

In the example shown in FIG. 14B, the first recess 5 receives the electronic components 23. The first recess 5 is defined by multiple insulating layers 2c with the upper insulating layer 2c having a smaller opening than the lower insulating layer 2c in a cross-sectional view. This structure lowers the likelihood that, for example, solder used to mount the electronic components 23 flows onto the surface of the substrate 2, thus improving the yield in fabricating the electronic package 21 and reduces malfunctions caused by the solder or the sealing resin flowing onto the surface of the substrate 2.

The present invention is not limited to the examples described in the above embodiments. All the embodiments according to the present invention may be variously modified, including numerical values. For example, although the electrode pads 3 are rectangular as viewed from above in the illustrated examples, they may be circular or polygonal. In the present embodiments, any number of electrodes 3 with any shapes may be used in any arrangement, and the electronic device may be mounted with any method. The characteristic features according to the embodiments may be variously combined, without being limited to the examples described in the above embodiments. For example, the recess may not be quadrangular and have rounded corners.

REFERENCE SIGNS LIST 1 electronic device mounting board
2 substrate
2a first surface
2b second surface
2c insulating layer
3d ceramic coating
3 electrode pad
3a external part
5 first recess
6 second recess
6a wall
10 electronic device
11 semiconductor device
12 lid
13 first connection (for electronic device)
14 bond (for lid bonding)
15 second connection (for semiconductor device)
21 electronic package
23 electronic component
31 electronic module
32 housing

The invention claimed is:

1. An electronic device mounting board, comprising:
a quadrangular substrate in plan view having a first surface and a second surface opposite to the first surface;
a plurality of first recesses along an outer edge of the substrate located on the first surface and comprising a side wall;
a second recess located on the second surface; and
electrode pads located in at least one of the plurality of first recesses and comprising a side surface, at least a portion of the side surface being apart from the side wall of the at least one first recess,
wherein the electrode pads are located separate from the second recess in a plan view, and
the least one of the plurality of first recesses has a side wall including a ceramic coating, and is located separate from the second recess in a plan view.

2. The electronic device mounting board according to claim 1, wherein
the at least one of the plurality of first recesses is smaller than the second recess in a plan view.

3. The electronic device mounting board according to claim 1, wherein
at least one of the plurality of first recesses has a side wall including a stepped ceramic coating having a plurality of steps.

4. The electronic device mounting board according to claim 1, wherein
the second recess includes an internal wall.

5. The electronic device mounting board according to claim 1, wherein
at least one of the plurality of first recesses has a side wall including a stepped ceramic coating having a plurality of steps, and a side wall perpendicular to the substrate made of an insulating layer.

6. The electronic device mounting board according to claim 1, wherein
the at least one of the plurality of first recesses is less deep than the second recess.

7. The electronic device mounting board according to claim 1, wherein
all the sidewalls of the at least one of the plurality of first recesses are inclined surfaces having openings that widen in the direction away from the substrate.

8. The electronic device mounting board according to claim 1, wherein
the plurality of first recesses are arranged symmetrically to one another about a center point of the substrate in a plan view.

9. An electronic package, comprising:
the electronic device mounting board according to claim 1; and
an electronic device mounted on the electronic device mounting board.

10. An electronic package, comprising:
the electronic device mounting board according to claim 1; and
an electronic device mounted in an area on the first surface of the electronic device mounting board, the area being surrounded by the electrode pads.

11. An electronic module, comprising:
the electronic package according to claim 9; and
a housing over the electronic package.

* * * * *